(12) United States Patent
Ke et al.

(10) Patent No.: US 10,770,292 B2
(45) Date of Patent: Sep. 8, 2020

(54) WAFER TREATMENT FOR ACHIEVING DEFECT-FREE SELF-ASSEMBLED MONOLAYERS

(71) Applicant: Applied Materials, Inc., Santa Clara, CA (US)

(72) Inventors: Chang Ke, Sunnyvale, CA (US); Lei Zhou, San Jose, CA (US); Biao Liu, San Jose, CA (US); Cheng Pan, San Jose, CA (US); Yuanhong Guo, San Jose, CA (US); Liqi Wu, San Jose, CA (US); Michael S. Jackson, Sunnyvale, CA (US); Ludovic Godet, Sunnyvale, CA (US); Tobin Kaufman-Osborn, Sunnyvale, CA (US); Erica Chen, Cupertino, CA (US); Paul F. Ma, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/008,495

(22) Filed: Jun. 14, 2018

(65) Prior Publication Data
US 2018/0366317 A1 Dec. 20, 2018

Related U.S. Application Data

(60) Provisional application No. 62/519,834, filed on Jun. 14, 2017.

(51) Int. Cl.
*H01L 21/027* (2006.01)
*H01L 21/02* (2006.01)
*H01L 21/67* (2006.01)
*H01L 21/3105* (2006.01)
*H01L 21/683* (2006.01)
*H01L 21/32* (2006.01)

(52) U.S. Cl.
CPC ...... *H01L 21/0271* (2013.01); *H01L 21/0206* (2013.01); *H01L 21/0228* (2013.01);
(Continued)

(58) Field of Classification Search
CPC .......... H01L 21/02741; H01L 21/0206; H01L 21/02181; H01L 21/02334; H01L 21/627207
See application file for complete search history.

(56) References Cited

U.S. PATENT DOCUMENTS

| 2002/0144886 A1* | 10/2002 | Engelmann | ............ H03K 17/96 200/600 |
| 2006/0261434 A1* | 11/2006 | Lazovsky | .............. B82Y 30/00 257/499 |

(Continued)

FOREIGN PATENT DOCUMENTS

JP 2008177283 A 7/2008

OTHER PUBLICATIONS

PCT International Search Report and Written Opinion in PCT/US2018/037512 dated Oct. 2, 2018, 13 pages.
(Continued)

*Primary Examiner* — Dale E Page
*Assistant Examiner* — Quovaunda Jefferson
(74) *Attorney, Agent, or Firm* — Servilla Whitney LLC (57) ABSTRACT

Methods of depositing a film selectively onto a first material relative to a second material are described. The substrate is pre-cleaned by heating the substrate to a first temperature, cleaning contaminants from the substrate and activating the first surface to promote formation of a self-assembled monolayer (SAM) on the first material. A SAM is formed on the first material by repeated cycles of SAM molecule exposure, heating and reactivation of the first material. A final exposure to the SAM molecules is performed prior to selectively depositing a film on the second material. Apparatus to perform the selective deposition are also described.

27 Claims, 8 Drawing Sheets

(52) U.S. Cl.
CPC .. *H01L 21/02057* (2013.01); *H01L 21/02181* (2013.01); *H01L 21/02266* (2013.01); *H01L 21/02274* (2013.01); *H01L 21/02334* (2013.01); *H01L 21/3105* (2013.01); *H01L 21/67207* (2013.01); *H01L 21/32* (2013.01); *H01L 21/6831* (2013.01)

(56) References Cited

U.S. PATENT DOCUMENTS

| | | | |
|---|---|---|---|
| 2013/0210238 A1* | 8/2013 | Yudovsky | H01L 21/02104 438/758 |
| 2015/0217330 A1 | 8/2015 | Haukka et al. | |
| 2016/0343580 A1 | 11/2016 | Hudson | |
| 2017/0062210 A1 | 3/2017 | Visser et al. | |
| 2017/0133608 A1 | 5/2017 | Fuse et al. | |
| 2017/0256402 A1* | 9/2017 | Kaufman-Osborn | H01L 21/76826 |

OTHER PUBLICATIONS

Sampson, Matthew D., et al., "Inhibiting Metal Oxide Atomic Layer Deposition: Beyond Zinc Oxide, Supporting Information", ACS Publications, 2017, pp. S1-S6.

Sampson, Matthew D., et al., "Inhibiting Metal Oxide Atomic Layer Deposition: Beyond Zinc Oxide", ACS Publications, Accepted Mar. 23, 2017, pp. A-H.

* cited by examiner

WAFER TREATMENT FOR ACHIEVING DEFECT-FREE SELF-ASSEMBLED MONOLAYERS

CROSS-REFERENCE TO RELATED APPLICATIONS

This application claims priority to U.S. Provisional Application No. 62/519,834, filed Jun. 14, 2017, the entire disclosure of which is hereby incorporated by reference herein.

FIELD

Embodiments of the disclosure generally relate to methods and apparatus to selectively depositing a film. More particularly, embodiments of the disclosure are directed to methods and apparatus to pre-treat a substrate to achieve defect-free self-assembled monolayers in selective deposition applications.

BACKGROUND

In recent decades, the semiconductor community has made attempts to improve integrated circuit (IC) processing by replacing lithography steps with alternatives that translate to lower cost, reduced processing time, and smaller feature sizes. Many of these alternatives fall under the blanket category of "selective deposition." In general, selective deposition refers to a process for which the net deposition rate is higher on the target substrate material relative to other substrate materials, such that the film thickness is achieved on the target substrate material with negligible deposition on the other substrate materials (where "negligible" is defined by process constraints).

Selective deposition is believed to be an effective technique to significantly reduce the cost of the patterning process in semiconductor device fabrication. Selective deposition helps reduce the complexity of process flow resulting in less process steps and higher throughput.

One general strategy to achieve selective deposition employs the use of blocking layers. Ideally, this strategy involves (1) formation of a blocking layer on substrate materials on which deposition is to be avoided with negligible impact to the target substrate material, (2) deposition on the target substrate material (where deposition on other substrate materials is "blocked" by the blocking layer), and (3) removal of the blocking layer without net adverse effects to the deposited film.

One manner of selective deposition uses self-assembled monolayers (SAMs) to enhance the process or deposition selectivity. One of the key elements of a SAM selective deposition process is the quality of the SAM. For example, a layer of defect free and well packed SAM is important for achieving high quality selective deposition. A SAM defect is any form of nanometer size particles or contaminates generated during SAM deposition process. These particles or contaminants can eventually translate into a failed circuit and cause device yield loss. In addition, the packing quality of SAM molecules determines the blocking efficiency which is related to the deposition selectivity. Accordingly the application of selective deposition is largely dependent on the quality of the SAM layer.

Therefore, there is a need in the art for apparatus and methods to achieve high quality defect free SAM on dielectric or metal surfaces.

SUMMARY

One or more embodiments of the disclosure are directed to processing methods comprising providing a substrate with an exposed first material and an exposed second material. The substrate is exposed to a pre-clean process comprising heating the substrate to a first temperature, cleaning the substrate of contaminants and activating a surface of the first material to promote formation of a self-assembled monolayer (SAM) on the exposed first material. A SAM is formed on the exposed first material at a second temperature by exposing the substrate to a plurality of cycles of a SAM formation process followed by a final exposure to a SAM molecule. Each cycle of the SAM formation process comprises exposing the substrate to the SAM molecule followed by heating the substrate and reactivation of the surface. A film is selectively deposited on the exposed second material.

Additional embodiments of the disclosure are directed to processing methods comprising: (a) providing a substrate with an exposed first material and an exposed second material; (b) exposing the substrate to a pre-clean process comprising heating the substrate to a first temperature, cleaning the substrate of contaminants, and exposing the first material to an activating agent comprising water vapor to promote formation of a self-assembled monolayer (SAM) on the exposed first material; (c) exposing the substrate to a SAM molecule at a second temperature that is less than the first temperature to form a portion of a SAM on the surface of the first material; (d) heating the substrate to a temperature greater than the second temperature; (e) exposing the substrate to an activating agent to reactivate the exposed surface of the first material; (f) repeating (c) through (e); (g) providing a final exposure of the SAM molecule to the substrate to form the SAM; and (h) selectively depositing a film on the exposed second material.

Further embodiments of the disclosure are directed to systems to manufacture an electronic device. The systems comprise a central transfer station, a pre-cleaning chamber, a SAM deposition chamber and at least one processor. The central transfer station comprises a robot to move one or more substrates between chambers connected to the central transfer station. The pre-cleaning chamber is connected to the central transfer station and comprises one or more of a heater, radical source or plasma source. The pre-cleaning chamber is in fluid communication with an activating agent. The SAM deposition chamber is connected to the central transfer station and comprises a pedestal to hold a substrate. The SAM deposition chamber is in fluid communication with one or more reactive gas sources to provide one or more flows of reactive gases to the SAM deposition chamber. The at least one processor is coupled to the central transfer station, the pre-cleaning chamber or the SAM deposition chamber. The at least one processor has one or more configurations to control the formation of a SAM on a first surface of a substrate. A first configuration can control cleaning of a substrate in the pre-cleaning chamber. The cleaning comprises heating the substrate to a first temperature and exposing the substrate to one or more of a plasma from a plasma source or radicals from a radical source. A second configuration can control the flow of the activating agent to the substrate. A third configuration can control movement of the substrate from the pre-cleaning chamber to the SAM deposition chamber through the central transfer station using the robot. A fourth configuration can form a SAM comprising multiple cycles of exposure to a SAM molecule, heating the substrate and exposure to an activating agent.

BRIEF DESCRIPTION OF THE DRAWINGS

So that the manner in which the recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used. In one or more embodiments, the first substrate surface may comprise a metal, metal oxide, or H-terminated $Si_xGe_{1-x}$, and the second substrate surface may comprise a Si-containing dielectric, or vice versa. In some embodiments, a substrate surface may comprise certain functionality (e.g., —OH, —NH, etc.).

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

Embodiments of the disclosure provide methods of selectively depositing a film onto one surface over a second surface. As used in this specification and the appended claims, the term "selectively depositing a film on one surface over another surface", and the like, means that a first amount of the film is deposited on the first surface and a second amount of film is deposited on the second surface, where the second amount of film is less than the first amount of film, or no film is deposited on the second surface. The term "over" used in this regard does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

Embodiments of the disclosure incorporate a blocking layer called a self-assembled monolayer (SAM). Fundamentally, SAMs are ordered assemblies formed by the adsorption of an active surfactant on a solid face. These molecules are typically comprised of one or more moieties with an affinity for the substrate (head group) and a relatively long, inert, linear hydrocarbon moiety (tail group). Due to surface property difference, the adsorption of SAM is heavily dependent on the material of the substrate, i.e., the deposition of SAM is selective. Without being bound by any particular theory of operation, it is believed that SAM formation happens through fast adsorption of molecular head groups at the substrate surface and slow association of molecular tail groups with each other through van der Waals interactions. SAM precursors are chosen such that the head group selectively reacts with the substrate materials to be blocked during deposition.

Following the SAM growth, deposition of a film can be performed. The long carbon chain of SAM blocks the growth of the film. As a consequence, the film grows substantially only in the area not covered by SAM achieving selective film deposition. The SAMs can be removed through thermal decomposition (with desorption of any byproducts) or an integration-compatible ashing process.

Figure 1A:
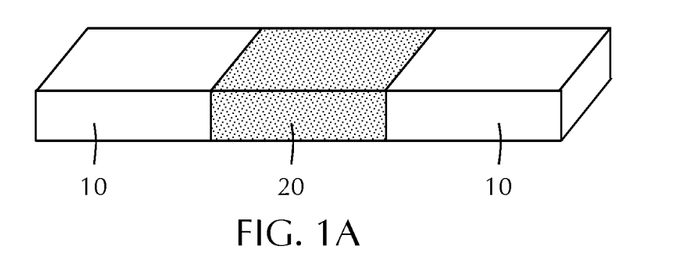
FIGS. 1A through 1C show a schematic of an ideal self-assembled monolayer assisted selective deposition process.
Figure 1B:
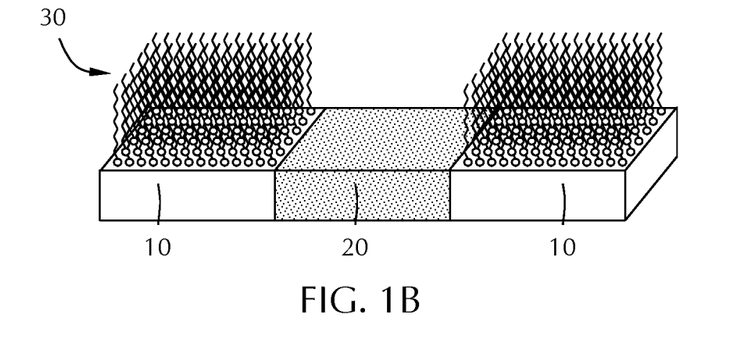
Figure 1C:
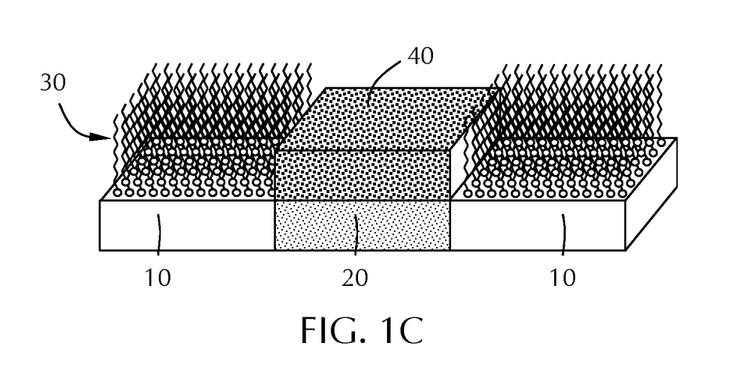

An idealized traditional process flow of selective deposition is shown in the FIGS. 1A through 1C. A patterned substrate includes a first material 10 and a second material 20. In FIG. 1B, a SAM 30 is grown by chemical vapor deposition (CVD) on the first material 10. In FIG. 1C, a third material 40 is deposited on the second material 20 by atomic layer deposition (ALD). The SAM 30 is used as a sacrificial layer to enable selective deposition of the third material 40 on the second material 20 without little or no deposition on the first material 10.

Figure 2A:
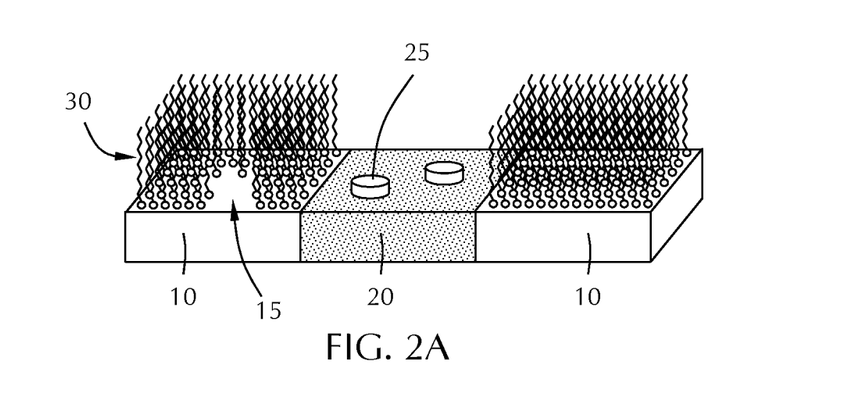
FIGS. 2A through 2C show a schematic of a conventional self-assembled monolayer assisted selective deposition process.
Figure 2B:
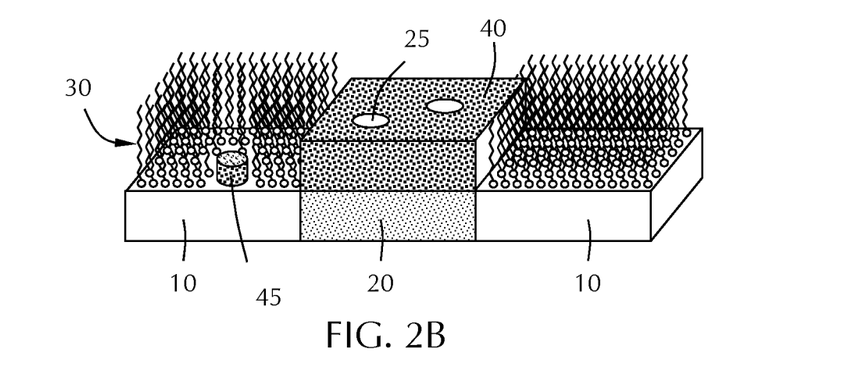
Figure 2C:
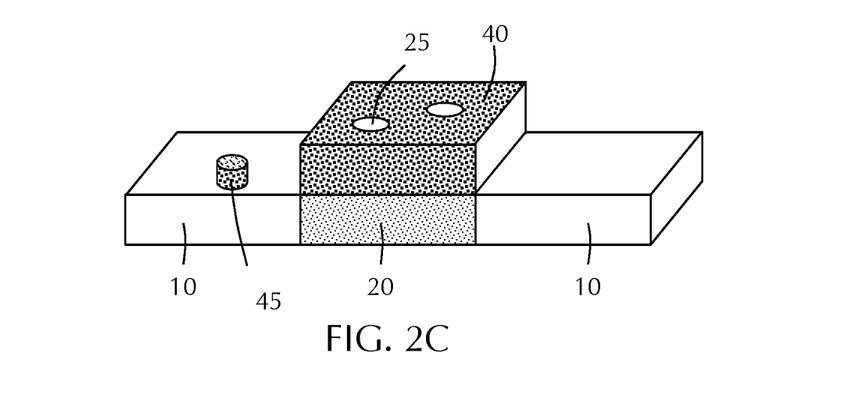

As the enabler for selective deposition, the quality of the SAM 30 layer is determinative of selectivity. There are two major issues that can degrade the SAM quality and deposition selectivity. As shown in FIG. 2A, nanometer size particles 25 can be generated on the second material 20 during SAM 30 growth on the first material 10 and packing defects 15 can be formed in the SAM 30. Additionally, particles 25 can be formed on the second material 20 during the formation of the SAM 30. As illustrated in FIG. 2B, the ALD growth is prevented by the SAMs but growth 45 can occur inside the SAM packing defect 15 area. The packing defects 15 create an issue with the SAM blocking ability on the first material 10. Additionally, the particles 25 can interfere with deposition of the third material 40 on the second material 20. FIG. 2C shows the growth 45 where there were SAM defects after removing the sacrificial SAM layer. These defects (i.e., growth on the first material 10 and particles 25 on the second material 20) can result in either an electrical short or break in the circuit, leading to a loss in yield of the device.

Accordingly, one or more embodiments of the disclosure provide processes to form SAM blocking layers without or with reduced defects. Some embodiments provide methods to deposit SAM blocking layers that reduce the particulate formation on the surfaces not being blocked. Some embodiments provide apparatus to perform a process to form a SAM blocking layer and deposit a material on unblocked surfaces.

In general, embodiments of the method include a wafer surface plasma treatment before SAM deposition and splitting of the SAM deposition process into multiple shorter phases. In-between some or each SAM deposition phase, a thermal treatment process can be added prior to the SAM deposition. In some embodiments, the plasma treatment process includes introduction of hydrogen radicals to remove the wafer surface absorbed organic contaminates and water vapor remote plasma source to activate the surface for SAM deposition. During the plasma treatment process, the wafer temperature and concentration of chemicals are controlled. In some embodiments, the SAM deposition is broken into short exposures. An interim thermal treatment can be used to remove low quality SAMs. The number of deposition/treatment cycles can be determined by the blocking requirement. Generally, more cycles will result in increased blocking performance with a gradual decrease in the incremental improvements between cycles as the surface blocking becomes saturated.

According to some embodiments, selective deposition of a film is enabled through the use of self-assembled monolayers (SAMs) to block deposition. Flaw or defects in the SAMs can cause failed circuits and device yield loss. In some embodiments, the wafer (or substrate) is pretreated to clean contaminants and heat the wafer to a temperature higher than a subsequent SAM step. The pre-clean process of some embodiments finishes with a surface treatment to replenish the hydroxyl terminations on the surface.

After pre-clean, the wafer can be moved to a SAM deposition chamber that has a process temperature lower than the temperature of the wafer during cleaning and transfer to the SAM deposition chamber. The higher temperature wafer, relative to the SAM deposition chamber, can help prevent condensation and surface contamination by particulate formation.

In some embodiments, the SAM formation process is a repeating pattern of SAM reactant exposure, exposure to a hydroxylating process and thermal treatment. The SAM formation process can be repeated any number of times to form a suitable SAM. The SAM formation process of some embodiments ends with a SAM exposure without subsequent heating or hydroxylation.

In some embodiments, when the wafer is moved into the SAM deposition chamber, the wafer is remains hotter than the conditions in the SAM deposition chamber. The wafer will equilibrate to the temperature of the pedestal in the SAM deposition chamber to be at the process temperature. Each cycle can reheat the wafer to a temperature greater than or equal to the SAM deposition chamber to prevent condensation and particulate formation.

In some embodiments, after SAM formation is complete, the wafer is moved directly to a processing chamber for formation of the film on the non-SAM containing surface. In one or more embodiments, the SAM is formed on a dielectric surface and the subsequent deposition is on a metal surface.

In some embodiments, the selectivity of the deposition process is improved by forming a more uniform SAM on the first surface and by reducing surface defects (particulates) on the second surface. In some embodiments, selective deposition is improved through the use of multiple SAM deposition processes with thermal treatments and surface activation (e.g., hydroxylation) in between.

Figure 3:
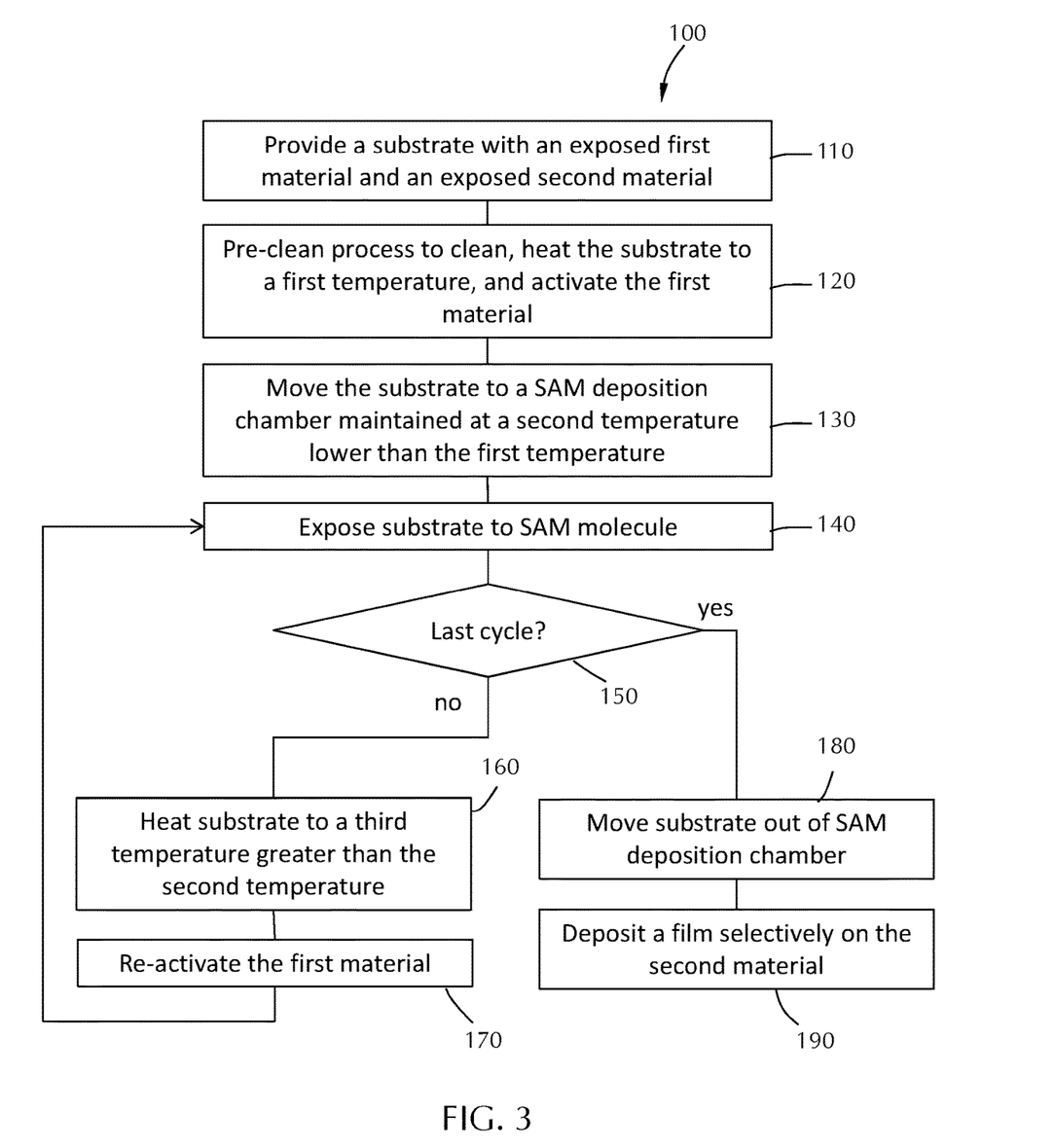
FIG. 3 illustrates a flowchart of a self-assembled monolayer assisted selective deposition method in accordance with one or more embodiment of the disclosure.
Figure 4A:
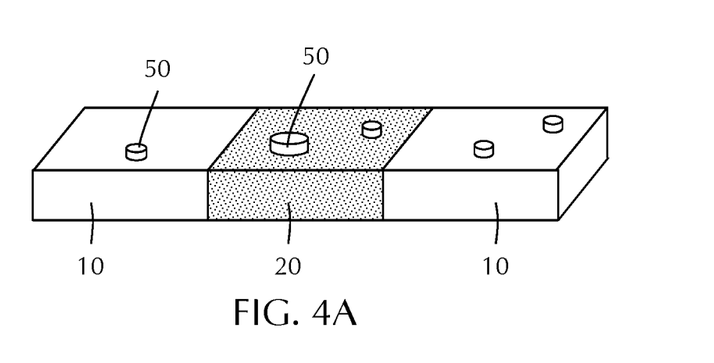
FIGS. 4A through 4C show a schematic of a pre-clean process in accordance with one or more embodiment of the disclosure.
Figure 4B:
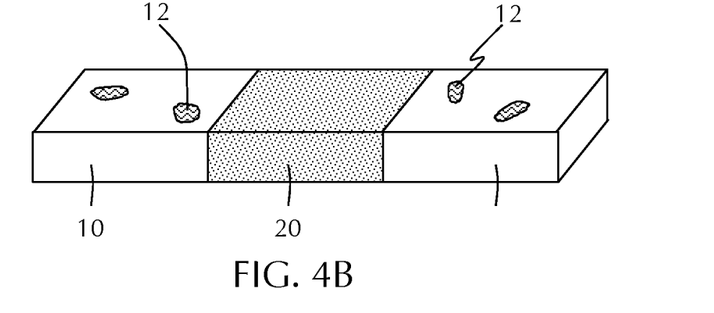
Figure 4C:
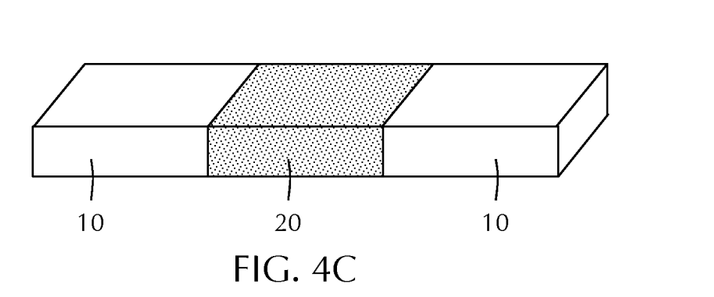

FIG. 3 provides a flowchart of an exemplary method 100 in accordance with one or more embodiment of the disclosure. FIGS. 4A through 4C illustrate a substrate with an exposed first material 10 and an exposed second material 20 going through the pre-clean process 120. An exposed surface, as used herein, refers to a surface that is available for surface reaction (i.e., not hindered by intervening molecules or chemistry (e.g., native oxides)). FIGS. 5A through 5H illustrate the substrate during SAM formation and FIG. 6 illustrates the substrate after deposition of the film 40. The substrates illustrated in FIGS. 4A through 6 show one first material 10 and one second material 20. Those skilled in the art will understand that this is merely for descriptive purposes and that a substrate can have more than one first material 10 and more than one second material 20.

In method 100, at stage 110, a substrate is provided for processing. As used in this manner, the term "provided" means that the substrate is placed into position for processing. The substrate and individual surfaces can be formed in-situ or can be formed ex-situ and moved into the process chamber or environment.

The substrate includes a first material 10 and a second material 20. Both the first material 10 and the second material 20 have exposed surfaces upon which a deposition or SAM formation can occur. The first material 10 of some embodiments comprises a dielectric. In some embodiments, the second material 20 comprises a metal or conductive material.

The pre-clean process 120 is illustrated in FIGS. 4A through 4C. In the pre-clean process 120, the substrate with the first material 10 and the second material 20 is heated. The substrate can be heated by any suitable heating components including, but not limited to, lamps, resistive heating or inductive heating. The pre-clean process 120 of some embodiments removes impurities, contaminants and defects on the substrate that might serve as a nucleation site. FIG. 4A illustrates a substrate with a first material 10 and a second material 20. Both the first material 10 and second material 20 are shown with particulates 50 on the surfaces.

FIG. 4B illustrate the substrate after heater where the first material 10 and the second material 20 have been cleaned of particulates 50. Deactivated areas 12 of the first material 10 are shown. These deactivated areas 12 can be present before heating or can arise as a result of the heating process. The deactivated areas 12 are any area that has a surface termination that is not favorable for the formation of a self-assembled monolayer. The substrate is exposed to an activating agent to remove the deactivated areas 12, as shown in FIG. 4C.

The activating agent can be any suitable compound that can convert the surface terminations to a termination that is favorable for SAM formation. In some embodiments, the first material 10 has a hydroxyl terminated surface and the deactivated areas 12 are not hydroxyl terminated. For example, the cleaning process can cause some of the surface hydroxyl groups to be removed. Exposure to the activating agent can replenish the hydroxyl groups so that an amino-substituted silane can form a closely packed self-assembled monolayer. The activating agent exposure and heating can occur sequentially or at the same time. In some embodiments, the substrate is heated and cleaned prior to exposure to the activating agent.

In some embodiments, the pre-clean process 120 occurs in a pre-clean chamber. The pre-clean chamber of some embodiments includes one or more of a remote plasma source (RPS), a radical source, pedestal or a heater.

The cleaning process of some embodiments includes exposing the substrate to one or more of a plasma or radicals. In some embodiments, the substrate is exposed to a plasma comprising one or more of He, Ar, Ne, Kr, $H_2$, $N_2$, $H_2O$, air, $O_2$, NO or $NO_2$. In some embodiments, the substrate is exposed to radicals generated in a remote plasma source using one or more of the plasma gases. In some embodiments, the substrate is exposed to radicals generated by passing one or more of He, Ar, Ne, Kr, $H_2$, $N_2$, $H_2O$, air, $O_2$, NO or $NO_2$ across a hot wire.

In some embodiments, the activating agent comprises water vapor. The water vapor can be exposed to the substrate and the first material 10 by being co-flowed into the processing chamber or pre-clean chamber in a carrier gas. In some embodiments, the activating agent is co-flowed with a carrier gas, diluent gas and/or inert gas. In one or more embodiments, the activating agent comprises water vapor generated in a remote plasma source and flowed in a pre-clean chamber to activate the substrate surface.

During the pre-clean process 120, the substrate is heated to a first temperature. The first temperature can be any suitable temperature that is greater than or equal to the deposition temperature to be used in the SAM formation process that will follow. In some embodiments, the first temperature is in the range of about 200° C. to about 350° C. In some embodiments, the first temperature is greater than a SAM deposition temperature by greater than or equal to about 10° C., 15° C., 20° C., 25° C., 50° C., 75° C. or 100° C.

The pressure in the pre-clean chamber can be in the range of about 1 to about 100 Torr. The substrate can be exposed to the pre-clean process for a time up to or equal to about 5 minutes, 4 minutes, 3 minutes, 2 minutes, 90 seconds, 60 seconds, 45 seconds or 30 seconds.

After cleaning the substrate, a self-assembled monolayer can be formed on the first material 10. In some embodiments, the substrate is moved 130 from a pre-clean chamber to a SAM deposition chamber for formation of the SAM. In some embodiments, the SAM is formed in the same chamber as the pre-clean.

In the SAM deposition chamber, the substrate is exposed to a SAM formation process. The SAM can be formed on the exposed first material 10 at a second temperature by exposing the substrate to a plurality of cycles of a SAM formation process followed by a final exposure to a SAM molecule. Each cycle of the SAM formation process comprises a SAM molecule exposure 140 (see FIG. 3).

The second temperature is less than or equal to about the first temperature so that the substrate is heated in the pre-clean chamber to a temperature that is higher than the temperature in the SAM deposition chamber. The substrate at the higher temperature can be moved to the SAM deposition chamber at a lower temperature and positioned on the substrate support. In the substrate support, the substrate can rapidly equilibrate to the temperature of the substrate support (i.e., the temperature of the SAM deposition chamber or process). With a substrate temperature greater than the temperature of the SAM deposition chamber there is a reduced risk or chance that condensation of particulates or contaminants will occur on the substrate surface so that subsequent SAM formation or deposition is not affected. In some embodiments, the second temperature is in the range of about 100° C. to about 200° C., or in the range of about 125° C. to about 175° C., or about 150° C. In some embodiments, the second temperature is less than the first temperature by an amount greater than or equal to about 10° C., 15° C., 20° C., 25° C., 50° C., 75° C. or 100° C.

Referring to FIG. 5A through 5H, the SAM 30 can be formed by multiple exposures to a SAM molecule 31. The SAM molecule can be any suitable molecule that can form a self-assembled monolayer on the first surface 10. In some embodiments, the SAM molecule comprises an amino-substituted silane with a non-polar tail. In some embodiments, the non-polar tail comprises an alkyl chain with greater than or equal to about 6 carbon atoms. In one or more embodiments, the SAM molecule comprises an amino-substituted silane with an 18 carbon chain tail.

Typically, formation of a self-assembled monolayer occurs over a period of time until approximately steady-state monolayer formation occurs. The amount of time that the substrate is exposed to the SAM molecules is less than the amount of time that would be employed to reach steady-state monolayer. In some embodiments, the amount of time that the substrate is exposed to the SAM molecule is in the range of about 10% to about 90% of the amount of time to reach steady-state. In some embodiments, the amount of time that the substrate is exposed to the SAM molecule is less than or equal to about 80%, 70%, 60%, 50%, 40%, 30%, 20% or 10% of the time to reach steady state. In some embodiments, the SAM molecule is exposed to the first material 10 for a time less than or equal to about 10 minutes, 9 minutes, 8 minutes, 7 minutes, 6 minutes, 5 minutes, 4 minutes, 3 minutes, 2 minutes, 1 minute, 45 seconds, 30 seconds, 25 seconds, 20 seconds or 15 seconds, for each cycle.

Figure 5A:
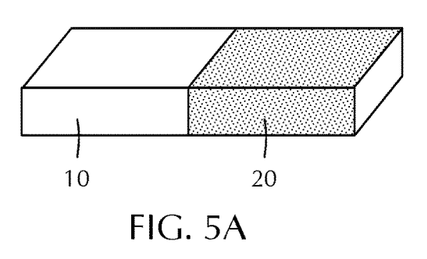
FIGS. 5A through 5H show a schematic representation of a SAM formation process in accordance with one or more embodiment of the disclosure.
Figure 5B:
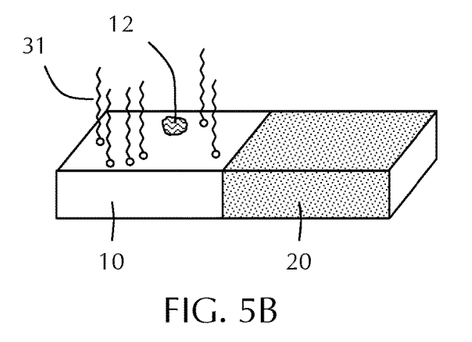
Figure 6:
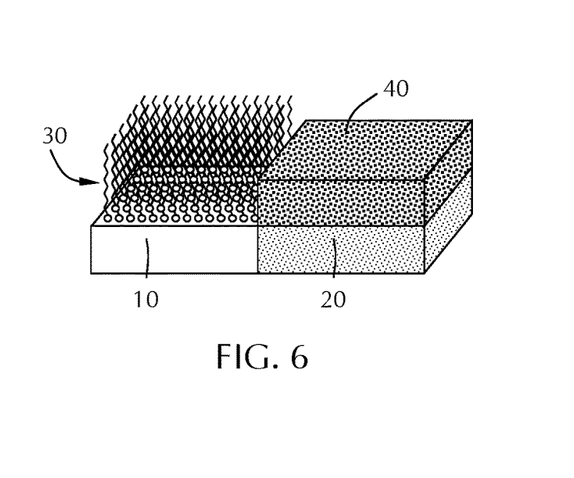
FIG. 6 shows a schematic of a substrate with a self-assembled monolayer assisted selective deposition in accordance with one or more embodiment of the disclosure.

Referring to FIG. 5B, a first amount of SAM molecules are adsorbed onto the first material 10. In some embodiments, the first amount of SAM molecules is in the range of about 10% to about 90% of a monolayer, or in the range of about 20% to about 80% of a monolayer, or in the range of about 30% to about 70% of a monolayer. In some embodiments, the first amount of SAM molecules adsorbed is less than or equal to about 80%, 70%, 60%, 50%, 40%, 30%, 20% or 10% of a monolayer.

The SAM molecules can be well-packed or dispersed across the first material 10. In the embodiment illustrated in FIG. 5B, the SAM molecules are dispersed about the surface and are not well-packed. Additionally, the exposure to the SAM molecules can form deactivated areas 12 on the first material 10. As used in manner, the term "well-packed" means that the spacing between SAM molecules 31 or the density of SAM molecules 31 per unit area are greater than or equal to 60%, 70%, 80% or 90% of the theoretical spacing or density for the monolayer.

Figure 5C:
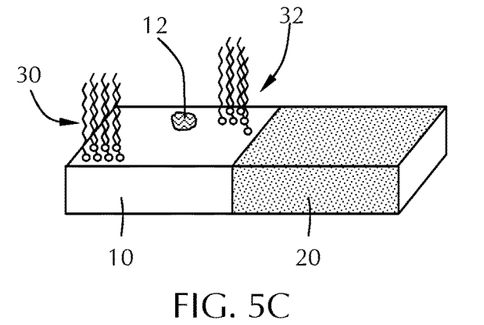

After exposure to the SAM molecules, the method 100 reaches decision 150. If additional cycles of SAM molecule exposure are to follow, the method moves to heating 160. The substrate with the first material 10 with the partial monolayer of SAM molecules 31 is subjected to a heating process. The heating process elevates the temperature of the substrate to a third temperature that is greater than the second temperature. The SAM molecules 31 on the first material 10 surface can rearrange and form well-packed regions 32 of SAM molecules 31, as shown in FIG. 5C.

Figure 5D:
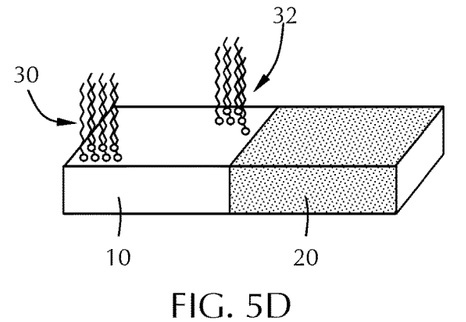

After heating 160, the first material 10 can be subjected to activation 170. Activation 170 comprises exposing the substrate to an activating agent to reactivate the deactivated areas 12, as shown in FIG. 5D.

The heating 160 and activation 170 can be performed in the same chamber as the SAM molecule exposure or in a different chamber. In some embodiments, the substrate is moved from the SAM deposition chamber to the pre-clean chamber for heating 160 and activation 170 and then moved back to the SAM deposition chamber for subsequent SAM molecule exposure 140.

Figure 5E:
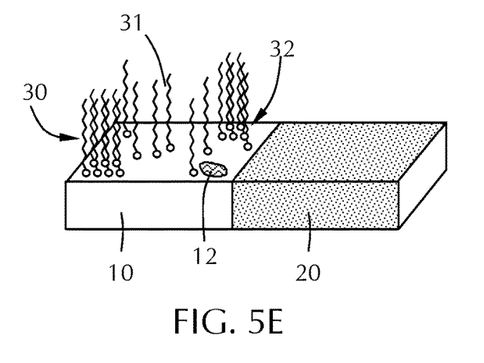
Figure 5F:
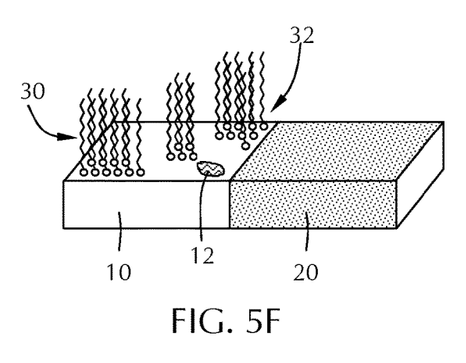
Figure 5G:
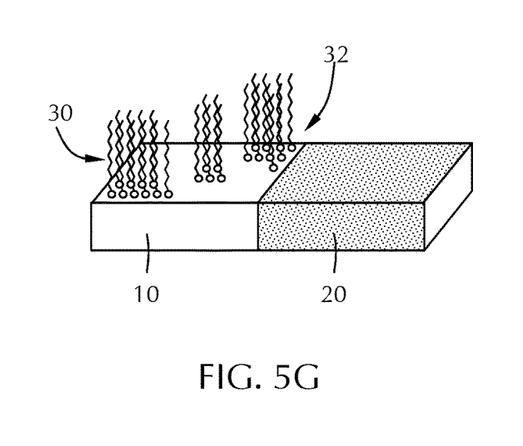

The method 100 repeats the SAM molecule exposure 140. As shown in FIG. 5E, additional SAM molecules 31 are adsorbed onto the first material 10. The additional SAM molecules 31 can be dispersed across the surface so that there are regions of well-packed molecules and regions of loosely-packed molecules. Addition regions of the first material 10 surface can also become deactivated. FIG. 5F shows the result of heating 160 the substrate to form well-packed regions 32 of SAM molecules and FIG. 5G illustrates the effect of activation 170 of the first material 10 to remove any deactivated areas 12.

Figure 5H:
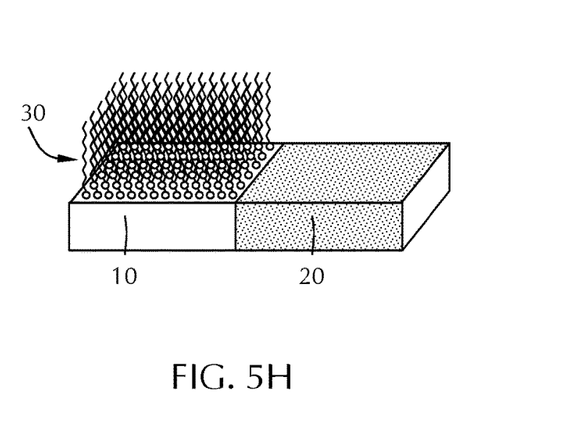

The cycle of SAM molecule exposure 140, heating 160 and activation 170 can be repeated, assuming that decision 150 follows the 'no' path shown in FIG. 3. The cycle repeats until the decision point 150 has a positive result that will stop the cycle from proceeding to the heating and activation stages. FIG. 5H shows a substrate with a first material 10 and a second material 20 with a well-packed SAM 30 on the first material 10. There are little or no particulates 50 or diffusely packed areas of the SAM 30.

As shown in FIG. 6, after formation of the well-packed SAM 30, the substrate can be subjected to a selective deposition process where a film 40 is deposited on the second material 20 and substantially no film is deposited on the first material 10. As used in this manner, the term "substantially no film" means that the surface has less than or equal to about 5%, 4%, 3%, 2% or 1% area that has the film 40 deposited thereon.

In some embodiments, the film 40 is deposited 190 on the second material 20 in a different process chamber than the SAM deposition chamber. The method 100 might include moving the substrate from the SAM deposition chamber 180 after the final exposure to the SAM molecule to a selective deposition chamber. The selective deposition chamber can be any suitable deposition chamber including, but not limited to, a chemical vapor deposition (CVD) chamber, an atomic layer deposition (ALD) chamber, a plasma-enhanced chemical vapor deposition (PECVD) chamber, a plasma enhanced atomic layer deposition (PEALD) chamber, or a physical vapor deposition (PVD) chamber.

The film 40 can be any suitable material depending on the process being implemented. In some embodiments, the film 40 is deposited to the second material 20 as a hafnium oxide film. In some embodiments, the film 40 is a dielectric material. In some embodiments, the film 40 is a high-k dielectric (k>5). In some embodiments, the film 40 is a low-k dielectric (k<=5).

Figure 7:
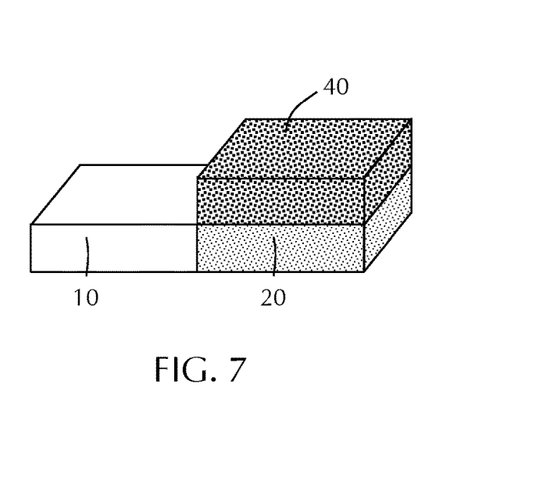
FIG. 7 shows a schematic of a substrate after removal of the SAM after selective deposition in accordance with one or more embodiment of the disclosure.

After deposition of the film 40, the SAM can be left on the first material 10 or removed. In some embodiments, the SAM is removed from the first material 10 after deposition of the film 40, as shown in FIG. 7. Removing the SAM can be accomplished by any suitable method depending on, for example, the SAM molecule used or the thermal budget of the device being formed. In some embodiments, removing the SAM comprises one or more of a plasma ash process or thermal desorption.

Figure 8:
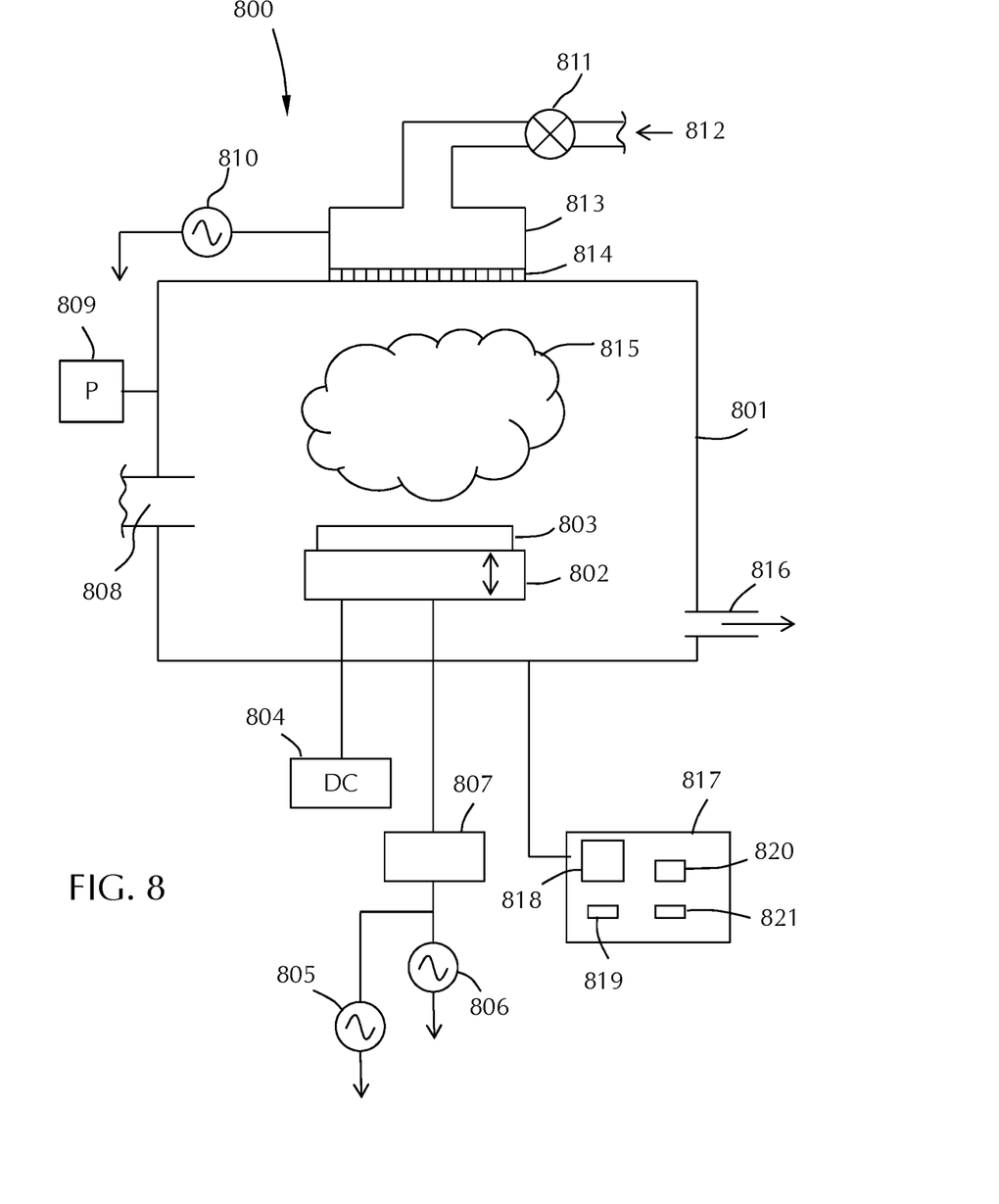
FIG. 8 is a block diagram of a process chamber in accordance with one or more embodiment of the disclosure.

FIG. 8 shows a block diagram of a plasma system 800 to perform at least some of the operations to pre-clean, form a SAM and/or the selective deposition process. The system 1800 illustrated has a processing chamber 801. A movable pedestal 802 to hold a substrate 803 that has been positioned in processing chamber 801. Pedestal 802 can comprise an electrostatic chuck ("ESC"), a DC electrode embedded into the ESC, and a cooling/heating base. In an embodiment, pedestal 802 acts as a moving cathode. In an embodiment, the ESC comprises an $Al_2O_3$ material, $Y_2O_3$, or other ceramic materials known to one of ordinary skill of electronic device manufacturing. A DC power supply 804 can be connected to the DC electrode of the pedestal 802. In some embodiments, the pedestal 801 includes a heater (not shown) that is capable of raising the temperature of the substrate to the first temperature. While an electrostatic chuck is illustrated as the pedestal 802, those skilled in the art will understand that this is merely exemplary and other pedestal types are within the scope of the disclosure.

As shown in FIG. 8, a substrate 803 can be loaded through an opening 808 and placed on the pedestal 802. System 800 comprises an inlet to input one or more process gases 812 through a mass flow controller 811 to a plasma source 813. A plasma source 813 comprising a showerhead 814 is coupled to the processing chamber 801 to receive one or more gases 812 to generate plasma. Plasma source 813 is coupled to a RF source power 810. Plasma source 813 through showerhead 814 generates a plasma 815 in processing chamber 801 from one or more process gases 812 using a high frequency electric field. Plasma 815 comprises plasma particles, such as ions, electrons, radicals or any combination thereof. In an embodiment, power source 810 supplies power from about 50 W to about 3000 W at a frequency from about 400 kHz to about 162 MHz to generate plasma 815.

A plasma bias power 805 is coupled to the pedestal 802 (e.g., cathode) via a RF match 807 to energize the plasma. In an embodiment, the plasma bias power 805 provides a bias power that is not greater than 1000 W at a frequency between about 2 MHz to 60 MHz, and in a particular embodiment at about 13 MHz. A plasma bias power 806 may also be provided, for example, to provide another bias power that is not greater than 1000 W at a frequency from about 400 kHz to about 60 MHz, and in a particular embodiment, at about 60 MHz. Plasma bias power 806 and bias power 805 are connected to RF match 807 to provide a dual frequency bias power. In an embodiment, a total bias power applied to the pedestal 802 is from about 10 W to about 3000 W.

As shown in FIG. 8, a pressure control system 809 provides a pressure to processing chamber 801. The chamber 801 has one or more exhaust outlets 816 to evacuate volatile products produced during processing in the chamber. In an embodiment, the plasma system 800 is an inductively coupled plasma (ICP) system. In an embodiment, the plasma system 800 is a capacitively coupled plasma (CCP) system.

In some embodiments, a control system 817 is coupled to the chamber 801. The control system 817 comprises a processor 818, a temperature controller 819 coupled to the processor 818, a memory 820 coupled to the processor 818, and input/output devices 821 coupled to the processor 818. The memory 820 can include one or more of transitory memory (e.g., random access memory) and non-transitory memory (e.g., storage).

In one embodiment, the processor 818 has a configuration to control one or more of: the formation of a SAM on a first surface of a substrate; cleaning of a substrate in the pre-cleaning chamber, the cleaning comprising heating the substrate to a first temperature and exposing the substrate to one or more of a plasma from a plasma source or radicals from a radical source; the flow of the activating agent to the substrate; forming a SAM comprising multiple cycles of exposure to a SAM molecule, heating the substrate and exposure to an activating agent.

The control system 817 can be configured to perform at least some of the methods as described herein and may be either software or hardware or a combination of both. The plasma system 800 may be any type of high performance processing plasma systems known in the art, such as but not limited to an etcher, a cleaner, a furnace, or any other plasma system to manufacture electronic devices.

Figure 9:
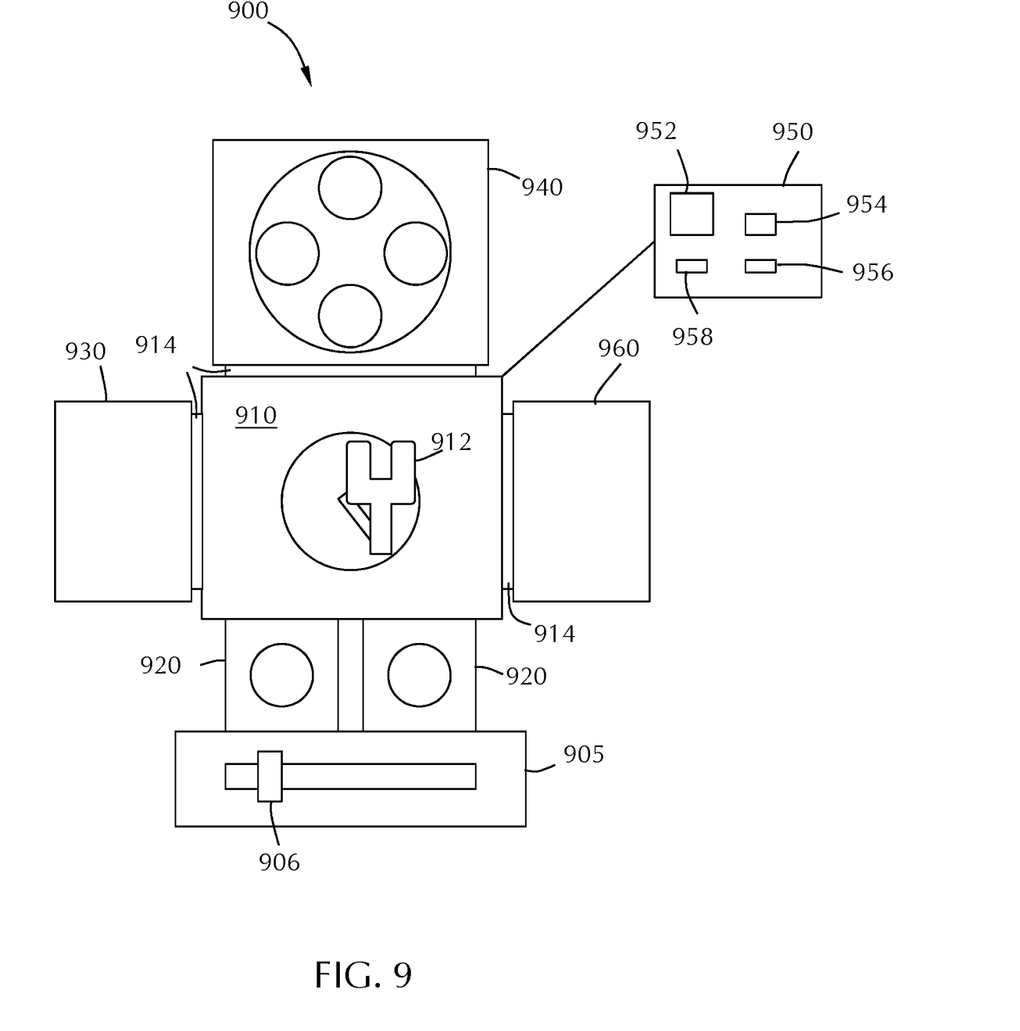
FIG. 9 is a block diagram of a cluster tool system in accordance with one or more embodiment of the disclosure.

FIG. 9 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean chamber 920 is connected to the central transfer station 910. The pre-clean chamber 920 can include one or more of a heater, a radical source or plasma source. The pre-clean chamber 920 is in fluid communication with an activating agent. An exemplary pre-clean chamber 920 is illustrated in FIG. 8 as a plasma system 800.

In some embodiments, there are two pre-clean chambers 920 connected to the central transfer station 910. In the embodiment shown in FIG. 9, the pre-clean chambers 920 can act as pass through chambers between the factory interface 905 and the central transfer station 910. The factory interface 905 can include one or more robot 906 to move substrate from a cassette to the pre-clean chamber 920. The robot 912 can them move the substrate from the pre-clean chamber 920 to other chambers within the system 900.

A SAM deposition 930 chamber can be connected to the central transfer station 910. The SAM deposition chamber 930 comprising a pedestal to hold a substrate. The SAM deposition chamber 930 is in fluid communication with one or more reactive gas sources to provide one or more flows of reactive gases to the SAM deposition chamber 930. The reactive gases of the SAM deposition chamber include the SAM molecule that can for the monolayer on the substrate.

The SAM deposition chamber 930 can be any suitable chamber that can provide a flow of SAM molecules and control the temperature of the substrate. The plasma system 800 shown in FIG. 8 can also be used as the SAM deposition chamber 930. The substrate can be moved to and from the SAM deposition chamber 930 by the robot 912 passing through isolation valve 914.

A selective deposition chamber 940 can also be connected to the central transfer station 910. The selective deposition chamber 940 can be any suitable deposition chamber including, but not limited to, CVD, ALD, PECVD, PEALD or PVD chambers. In some embodiments, the selective deposition chamber 940 comprises an ALD chamber. The ALD chamber can be a time-domain chamber where the reactive gases are sequentially exposed to the substrate so that only one reactive gas is present in the chamber at any given time. In some embodiments, the ALD chamber is a spatial ALD chamber with the reactive gases are flowed into separate regions of the processing chamber at the same time and the reactive gases are separated by a gas curtain to prevent gas phase reactions between the reactive gases. In a spatial ALD chamber, the substrate is moved between regions of the processing chamber containing the various reactive gases to deposit a film.

Other process chambers can be connected to the central transfer station 910. In the embodiment shown, an ashing chamber 960 is connected to the central transfer station 910 through isolation valve 914. The ashing chamber 960 can be any suitable chamber that can remove the SAM after selective deposition.

At least one controller 950 is coupled to the central transfer station 910, the pre-clean chamber 920, the SAM deposition chamber 930, the selective deposition chamber 940 or the ashing chamber 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and sub-processors.

The at least one controller 950 can have a processor 952, a memory 954 coupled to the processor 952, input/output devices 956 coupled to the processor 952 and circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 is configured to form a SAM on a first surface of a substrate. The controller 950 can have various configurations and each configuration can be stored separately in the memory 954 or in separate memories. A first configuration can control cleaning of a substrate in the pre-clean chamber 920. The first configuration may include instructions to heat the substrate to a first temperature and/or instructions to expose the substrate to one or more of a plasma from a plasma source or radicals from a radical source. A second configuration can control the flow of the activating agent to the substrate. A third configuration can control movement of the substrate from the pre-clean chamber 920 to the SAM deposition chamber 930 through the central transfer station 910 using the robot 912. A fourth configuration can form a SAM. The fourth configuration may include instructions to perform multiple cycles of exposure to a SAM molecule, heating the substrate and exposure to an activating agent. The fourth configuration may also include instructions to move the substrate between the SAM deposition chamber 930 and the pre-clean chamber 920 for the different exposure. A fifth configuration may include instructions to selectively deposit a film on the substrate in the selective deposition chamber 940. The fifth configuration may include instruction sets to move the substrate to the deposition chamber 940, heat the substrate in the chamber, provide a flow of gas to the chamber and/or remove the substrate after deposition. A sixth configuration may include instructions to remove the SAM from the substrate surface. The sixth configuration may include instructions to move the substrate to the ashing chamber 960 and providing gas flows and temperatures to remove the SAM. The controller can operate valves, actuators, motors, etc., to implement any of the configurations or processes as needed.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "some embodiments," "certain embodiments," "one or more embodiments" or "an embodiment" means that a particular feature, structure, material, or characteristic described in connection with the embodiment is included in some embodiments of the invention. Thus, the appearances of the phrases such as "in one or more embodiments," "in certain embodiments," "in some embodiments" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A processing method comprising:
   providing a substrate with an exposed first material and an exposed second material;
   exposing the substrate to a pre-clean process in a pre-clean chamber, the pre-clean process comprising heating the substrate to a first temperature, cleaning the substrate of contaminants and activating a surface of the first material to promote formation of a self-assembled monolayer (SAM) on the exposed first material;
   forming a SAM on the exposed first material at a second temperature by exposing the substrate to a plurality of cycles of a SAM formation process followed by a final exposure to a SAM molecule, each cycle of the SAM formation process comprising exposing the substrate to the SAM molecule followed by heating the substrate and reactivation of the surface of the first material; and
   selectively depositing a film on the exposed second material,
   wherein activating the surface of the first material comprises exposing the substrate to an activating agent comprising water vapor provided by a remote plasma source that generates hydroxyl terminations on the surface.

2. The processing method of claim 1, wherein the first temperature is in the range of about 200° C. to about 350° C.

3. The processing method of claim 1, wherein the pre-clean process further comprises exposing the substrate to one or more of plasma or radicals.

4. The processing method of claim 1, wherein the pre-clean chamber has a pressure in the range of about 1 to about 100 Torr.

5. The processing method of claim 1, further comprising moving the substrate from the pre-clean chamber to a SAM deposition chamber before forming the SAM.

6. The processing method of claim 5, wherein the second temperature is less than the first temperature.

7. The processing method of claim 5, wherein the SAM molecule comprises an amino-substituted silane with a non-polar tail.

8. The processing method of claim 7, wherein the non-polar tail comprises an alkyl chain with greater than or equal to about 6 carbon atoms.

9. The processing method of claim 5, further comprising moving the substrate from the SAM deposition chamber after the final exposure to the SAM molecule.

10. The processing method of claim 9, wherein the film deposited on the exposed second material comprises hafnium oxide.

11. The processing method of claim 5, further comprising removing the SAM.

12. The processing method of claim 11, wherein removing the SAM comprises one or more of a plasma ash process or thermal desorption.

13. A processing method comprising:
   (a) providing a substrate with an exposed first material and an exposed second material;
   (b) exposing the substrate to a pre-clean process in a pre-clean chamber, the pre-clean process comprising heating the substrate to a first temperature, cleaning the substrate of contaminants, and exposing the first material to an activating agent comprising water vapor to promote formation of a self-assembled monolayer (SAM) on an exposed surface of the first material;
   (b1) moving the substrate from the pre-clean chamber to a SAM deposition chamber, wherein the pre-clean process occurs in a pre-clean chamber at a first temperature in the range of about 200° C. to about 350° C. and the pre-clean process further comprises exposing the substrate to one or more of plasma or radicals;
   (c) exposing the substrate to a SAM molecule at a second temperature less than the first temperature to form a portion of a SAM on the exposed surface of the first material, the SAM molecule comprising an amino-substituted silane with a non-polar tail comprising an alkyl chain with greater than or equal to about 6 carbon atoms;
   (d) heating the substrate to a temperature greater than the second temperature;
   (e) exposing the substrate to an activating agent to reactivate the exposed surface of the first material;
   (f) repeating (c) through (e);
   (g) providing a final exposure of the SAM molecule to the substrate to form the SAM; and
   (h) selectively depositing a film on the exposed second material.

14. The processing method of claim 13, further comprising (i) removing the SAM by exposing the SAM to one or more of a plasma ash process or thermal desorption.

15. A system to manufacture an electronic device, the system comprising;
   a central transfer station comprising a robot to move one or more substrates between chambers connected to the central transfer station;
   a pre-cleaning chamber connected to the central transfer station, the pre-cleaning chamber comprising one or more of a heater, radical source or plasma source, the pre-cleaning chamber in fluid communication with an activating agent;
   a SAM deposition chamber connected to the central transfer station, the SAM deposition chamber comprising a pedestal to hold a substrate, the SAM deposition chamber in fluid communication with one or more reactive gas sources to provide one or more flows of reactive gases to the SAM deposition chamber; and
   a control system comprising at least one processor coupled to one or more of the central transfer station, the pre-cleaning chamber or the SAM deposition chamber, the at least one processor configured to control formation of a SAM on a first surface of a substrate, the at least one processing having one or more of, a first configuration to control cleaning of a substrate in the pre-cleaning chamber, the cleaning comprising heating the substrate to a first temperature and exposing the substrate to one or more of a plasma from the plasma source or radicals from the radical source, a second configuration to control a flow of the activating agent from a remote plasma source to the substrate, the activating agent comprising water vapor that generates hydroxyl terminations on the surface, a third configuration to control movement of the substrate from the pre-cleaning chamber to the SAM deposition chamber through the central transfer station using the robot, and a fourth configuration to form a SAM, forming a SAM comprising multiple cycles of exposure to a SAM molecule, heating the substrate and exposure to an activating agent.

16. A processing method comprising:
providing a substrate with an exposed first material and an exposed second material;
exposing the substrate to a pre-clean process in a pre-clean chamber, the pre-clean process comprising heating the substrate to a first temperature, cleaning the substrate of contaminants and activating a surface of the first material to promote formation of a self-assembled monolayer (SAM) on the exposed first material;
moving the substrate from the pre-clean chamber to a SAM deposition chamber;
forming a SAM in the SAM deposition chamber on the exposed first material at a second temperature by exposing the substrate to a plurality of cycles of a SAM formation process followed by a final exposure to a SAM molecule, each cycle of the SAM formation process comprising exposing the substrate to the SAM molecule followed by heating the substrate and reactivation of the surface of the first material, the SAM molecule comprising an amino-substituted silane with a non-polar tail; and
selectively depositing a film on the exposed second material, wherein activating the surface of the first material comprises exposing the substrate to an activating agent that generates hydroxyl terminations on the surface.

17. The processing method of claim 16, wherein the first temperature is in the range of about 200° C. to about 350° C.

18. The processing method of claim 16, wherein the pre-clean process further comprises exposing the substrate to one or more of plasma or radicals.

19. The processing method of claim 16, wherein the pre-clean chamber has a pressure in the range of about 1 to about 100 Torr.

20. The processing method of claim 16, wherein the activating agent comprises water vapor.

21. The processing method of claim 20, wherein the water vapor is provided by a remote plasma source.

22. The processing method of claim 16, wherein the second temperature is less than the first temperature.

23. The processing method of claim 16, wherein the non-polar tail comprises an alkyl chain with greater than or equal to about 6 carbon atoms.

24. The processing method of claim 16, further comprising moving the substrate from the SAM deposition chamber after the final exposure to the SAM molecule.

25. The processing method of claim 24, wherein the film deposited on the exposed second material comprises hafnium oxide.

26. The processing method of claim 16, further comprising removing the SAM.

27. The processing method of claim 26, wherein removing the SAM comprises one or more of a plasma ash process or thermal desorption.

* * * * *